(12) United States Patent
Dubey

(10) Patent No.: US 7,380,187 B2
(45) Date of Patent: May 27, 2008

(54) BOUNDARY SCAN TESTER FOR LOGIC DEVICES

(75) Inventor: Rohit Dubey, Allahabad (IN)

(73) Assignee: STMicroelectronics Pvt. Ltd., Uttar Pradesh (IN)

(*) Notice: Subject to any disclaimer, the term of this patent is extended or adjusted under 35 U.S.C. 154(b) by 272 days.

(21) Appl. No.: 11/024,946

(22) Filed: Dec. 29, 2004

(65) Prior Publication Data

US 2005/0204229 A1 Sep. 15, 2005

(30) Foreign Application Priority Data

Dec. 29, 2003 (IN) .............................. 1630/2003

(51) Int. Cl.
*G01R 31/317* (2006.01)
*G01R 31/40* (2006.01)

(52) U.S. Cl. ...................................... 714/727; 714/726

(58) Field of Classification Search ................ 714/727, 714/726, 724, 729, 733; 326/16, 21
See application file for complete search history.

(56) References Cited

U.S. PATENT DOCUMENTS 5,490,260 A * 2/1996 Miller et al. ................. 711/100
5,701,307 A * 12/1997 Whetsel ........................ 714/29
5,745,500 A * 4/1998 Damarla et al. ............. 714/732
5,991,909 A * 11/1999 Rajski et al. ................ 714/729
6,314,539 B1 * 11/2001 Jacobson et al. ........... 714/727
6,556,037 B2 * 4/2003 Shiraishi ..................... 324/765
6,748,456 B1 * 6/2004 Stanton et al. ................. 710/1

* cited by examiner

*Primary Examiner*—Cynthia Britt
*Assistant Examiner*—Dipakkumar Gandhi
(74) *Attorney, Agent, or Firm*—Lisa K. Jorgenson; Stephen Bongini; Fleit Kain Gibbons Gutman Bongini & Bianco P.L.

(57) ABSTRACT

A boundary scan tester is provided for testing logic devices. The boundary scan tester includes a boundary scan register, a data decompressor, a data compressor, and a derived boundary scan register. The boundary scan register registers the applied test vectors and test responses of a logic device, and the data decompressor is coupled to an input of the boundary scan register for decompressing the applied compressed test vectors. The data compressor is coupled to an output of the boundary scan register for compressing the test responses, and the derived boundary scan register is coupled to an input of the decompressor and an output of the compressor for storing and shifting in/out the compressed test vectors and test responses.

19 Claims, 5 Drawing Sheets

BOUNDARY SCAN TESTER FOR LOGIC DEVICES

CROSS-REFERENCE TO RELATED APPLICATIONS

This application is based upon and claims priority from prior Indian Patent Application No. 1630/Del/2003, filed Dec. 29, 2003, the entire disclosure of which is herein incorporated by reference.

FIELD OF THE INVENTION

The present invention relates to the testing of logic circuits, and more particularly to methods and devices for high speed testing through JTAG in logic devices.

BACKGROUND OF THE INVENTION

Boundary scan testing is well known. Boundary scan testing uses boundary scan shift registers that are built into each integrated circuit. FIG. 1 shows a conventional IC device 13 including boundary-scan register 11 interposed between the device I/O pins 12 and core 10, which may be programmable memory latches in the case of programmable devices. Data can be directly transferred between memory latches and the boundary scan register through interconnect 15.

FIG. 2 depicts a conventional IEEE 1149.1 compliant device architecture 31 that is referred to as a "boundary-scan architecture". Boundary-scan architecture 31 includes a Test Access Port (TAP) 30, a TAP controller 20, an instruction register 26, instruction decode logic 25, a data register bank 24, and an output stage comprising a multiplexer 27, a flip-flop 28, and a tristate buffer 29. Although instruction decode logic 25 is shown as being separate from instruction register 26, instruction decode logic 25 may also be considered to be part of instruction register 26. Data register bank 24 includes the boundary-scan register 22 described above, and a bypass register 21. Bypass register 21 is a single bit shift register not associated with the IC core logic (memory latches) or I/O pins. Its purpose is to provide an alternate serial path between TDI and TDO pins of a JTAG-compliant device. As described below, only one of the registers in data bank 24 forms the serial path between TDI and TDO at any given time.

The TAP 30 is the interface between the boundary-scan architecture 31 and the five IC device pins required by IEEE 1149.1: test data in (TDI) and test data out (TDO) pins described above, test clock (TCK) pin, test mode select (TMS) pin, and one optional pin test reset (TRST) pin.

FIG. 3 depicts all possible states of the TAP controller 20, which is a sixteen-state state machine driven by the TCK and TMS signals asserted at the respective TCK and TMS pins of the IC device. The TAP controller 20 transitions from an existing state to one of the two possible states at the rising edge of the TCK signal based on the level of the TMS signal. Of the sixteen TAP controller states, one state is used to reset the test logic "Test-Logic Reset", and another state is an idle state "Run-Test/Idle" from which either an instruction register scan or a data register scan can be selected. Of the remaining fourteen states, seven are used to perform a data register scan (from "Select DR Scan" to "Update DR") and seven are used to perform an instruction register scan (from "Select IR Scan" to "Update IR").

Instruction register scan and data register scan are symmetrical operations consisting of cycling the TAP controller 20 through a sequence of states to perform sample, shift, and transfer operations within the indicated register. In the case of an instruction register scan, the TAP controller 20 enters into a "Capture IR" state in which it issues an instruction register control signal to cause the instruction register to sample device status information. Then, in a "Shift IR" state, the device status information is shifted out of the instruction register via the TDO pin while a sequence of bits representing a new instruction is concurrently shifted into the instruction register via the TDI pin. After the new instruction has been shifted into the instruction register, it is transferred to a bank of output elements included in the instruction register 26 during an "Update IR" state of the TAP controller 20.

The instruction transferred to the bank of output elements in instruction register 26 is decoded by instruction decode logic 25 to select one of the registers in data register bank 24 to form a serial path between the TDI and TDO pins of the IC device through multiplexer 23, which is controlled by signals coming from instruction decode logic 25, to pass the output of either the boundary scan register 22 or the bypass register 21 to the output stage. As discussed below, the instruction in instruction register 26 is also decoded by instruction decode logic 25 to select the source of data shifted into the boundary scan register.

When the TAP controller 20 is sequenced through a data register scan, the TAP controller 20 issues control signals to each of the data registers included in data register bank 24. As discussed above, only one of the data registers from data register bank 24 is selected to form the serial data path between TDI and TDO at any given time, and the non-selected register is not disturbed during the data register scan. When the bypass register 21 is selected, the serial data path of the device is reduced to a single storage element, and data shifted through the bypass register 21 does not interfere with the normal operation of the device.

When the boundary scan register 11 in FIG. 1 is the data register selected to form the serial path between the TDI and TDO pins of the IC, sample, shift, and update operations similar to those performed in the instruction register 26 in FIG. 2 are performed. First, in a "Capture DR" state, the boundary scan register 11 samples the parallel data from the I/O 12 of the programmable device, if that portion of the boundary scan register is programmed as input, or samples the parallel data through interconnect 15, between boundary scan register 11 and memory latches 10, if that portion of the boundary scan cell is programmed as output. Then, in a "Shift DR" state, the boundary scan register 11 shifts a sequence of bits via TDI while concurrently shifting the values sampled during the "Capture DR" state out of the boundary scan register 11 via TDO. Finally, during the "update DR" state, the boundary scan register transfers the data to a bank of elements within the boundary scan register 11.

To comply with IEEE 1149.1, in FIG. 2 the boundary scan architecture 31 must be capable of carrying out three instructions: BYPASS, SAMPLE/PRELOAD, and EXTEST. The BYPASS instruction is used to select the bypass register 21 to form a serial path between TDI and TDO. The SAMPLE/PRELOAD instruction is used to select the boundary scan register 22 to form a serial path between TDI and TDO, and to permit the parallel data to be sampled in the boundary scan register 22 without interfering with the normal operation of the IC. The SAMPLE/PRELOAD instruction further permits the boundary scan register 22 to be loaded with a sequence of bits to be later output at the parallel output of boundary scan register 22. This operation is called "preload".

During the EXTEST instruction, the external data coming to the device at the input pins, which is the response of the applied test vector from other ICs on the same board to test the interconnects between ICs, is captured in boundary scan register 22 in the "Capture DR" state of TAP controller 20 and shifted out from boundary scan register 22 in the "Shift DR" state of the TAP controller 20 through the TDO pin and at the same time a new test vector is shifted into the boundary scan register 22 through the TDI pin to apply it on output pins in the "Update DR" state of the TAP controller 20.

The main problem with the existing IEEE 1149.1 architecture is the use of an excessive number of clock (TCK) cycles, which is equal to the number of boundary scan cells present in boundary scan register 22. To apply one test vector and receive one response, one has to travel the full length of boundary scan register. There is always a need to reduce clock cycles and thus to reduce testing time.

U.S. Pat. No. 6,266,801 provides a design to communicate with a plurality of tristate output buffers that are configured to receive a control signal and a data signal from an associated one of the plurality of data output boundary scan cells in order to reduce adverse timing impacts of conventional boundary scan cells. However, it employs large circuitry.

U.S. Pat. No. 5,355,369 speeds the testing of high-speed core logic circuitry by transferring the test program to a special test data register, which downloads the program to the logic circuitry under test, and uploads the results. However, it uses large numbers of user's I/Os and also does not reduce the scan path.

SUMMARY OF THE INVENTION

It is an object of the present invention to overcome the above-mentioned limitations and to provide a method for high speed testing through JTAG in a logic device.

Another object of the present invention is to enable high speed testing through JTAG in a logic device by drastically reducing the length of the boundary-scan path.

A further object of the present invention is to reduce the number of clock cycles by using compressed data flow between an on board logic device and a PC.

Yet another object of the present invention is to greatly reduce the number of test vectors required to test core logic of integrated circuits through compression.

Still another object of the present invention is to provide a minimal implication of a JTAG boundary scan cell that provides enhanced testing speed.

One embodiment of the present invention provides a boundary scan tester for logic devices. The tester includes a boundary scan register, a data decompressor, a data compressor, and a derived boundary scan register. The boundary scan register registers the applied test vectors and responses of a logic device, and the data decompressor is coupled to the input of the boundary scan register for decompressing the supplied compressed test vectors. The data compressor is coupled to the output of the boundary scan register for compressing the test responses, and the derived boundary scan register is coupled to the input of the decompressor and the output of the compressor for storing and shifting in/out the compressed test vectors and test responses. Thus, the number of clock cycles required for testing is reduced.

Another embodiment of the present invention provides a method for logic device testing. According to the method, compressed test vectors are fed, and the test vectors are decompressed for application to the logic under test. The test result obtained from the logic under test is compressed, and the compressed test result is output. Thus, the number of clock cycles required for testing is reduced.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

One preferred embodiment of the present invention provides a boundary scan tester for logic devices. The tester includes a boundary scan register, a data decompressor, a data compressor, and a derived boundary scan register. The boundary scan register registers the applied test vectors and responses of a logic device, and the data decompressor is coupled to the input of the boundary scan register for decompressing the supplied compressed test vectors. The data compressor is coupled to the output of the boundary scan register for compressing the test responses, and the derived boundary scan register is coupled to the input of the decompressor and the output of the compressor for storing and shifting in/out the compressed test vectors and test responses. Thus, the number of clock cycles required for testing is reduced.

Preferably, the logic device is a programmable logic device. In one embodiment, the boundary scan register and derived boundary scan register comprise memory elements. Preferably, the memory elements includes flip-flops.

In some embodiments, the data decompressor and data compressor include a series of data encoders and decoders and/or a digital signal processor. Preferably, the length of the derived boundary scan register depends on the degree of compression and algorithm used.

Another preferred embodiment of the present invention provides a method for logic device testing. According to the method, compressed test vectors are fed, and the test vectors are decompressed for application to the logic under test. The test result obtained from the logic under test is compressed, and the compressed test result is output. Thus, the number of clock cycles required for testing is reduced.

Preferably, the logic device is a programmable logic device, and the data decompressor, data compressor and derived boundary scan register are implemented using programmable logic elements.

Exemplary embodiments of the present invention will now be described in detail with reference to the figures.

Figure 1:
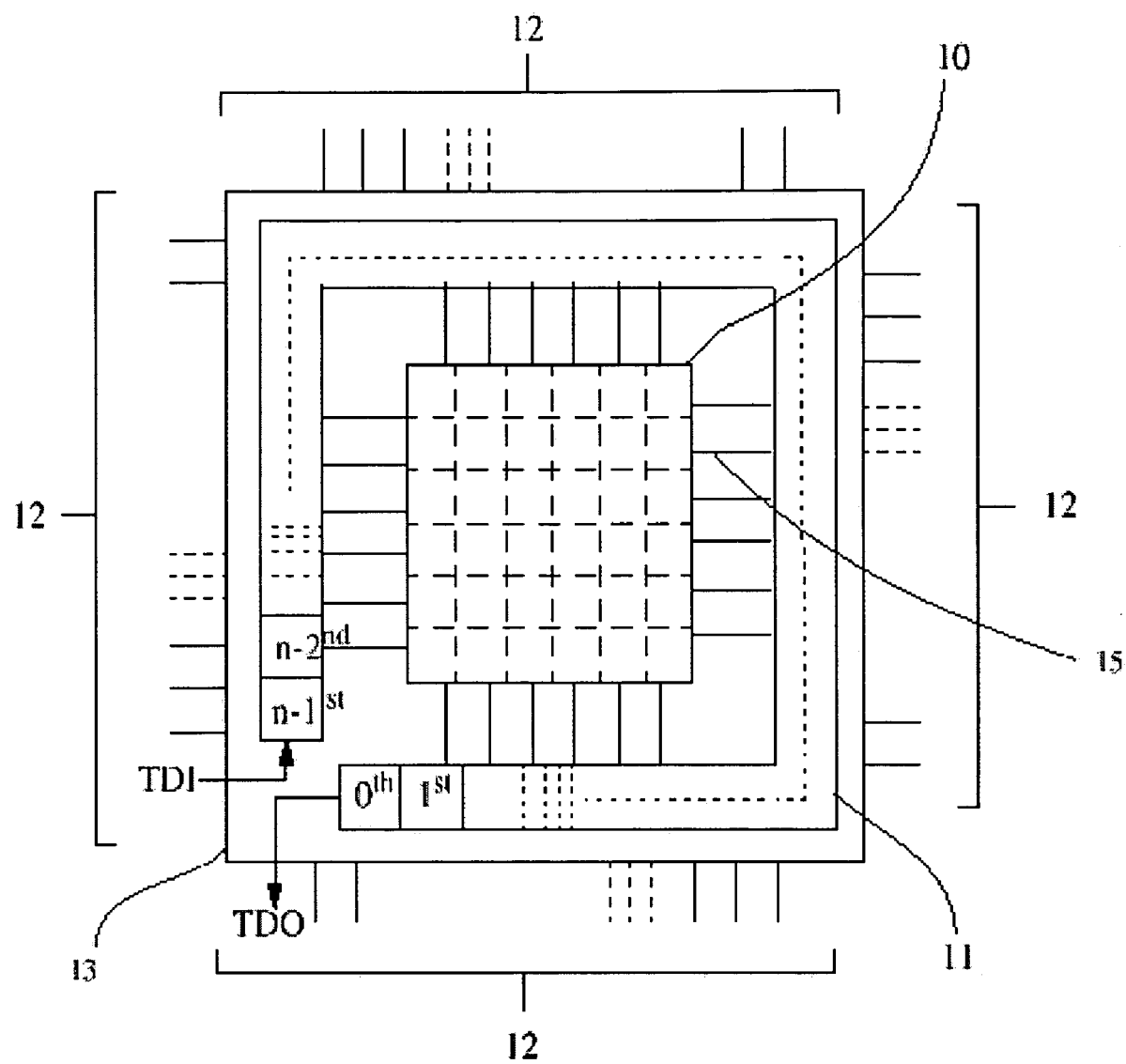
FIG. 1 shows a conventional IC device that includes a boundary-scan register.
Figure 2:
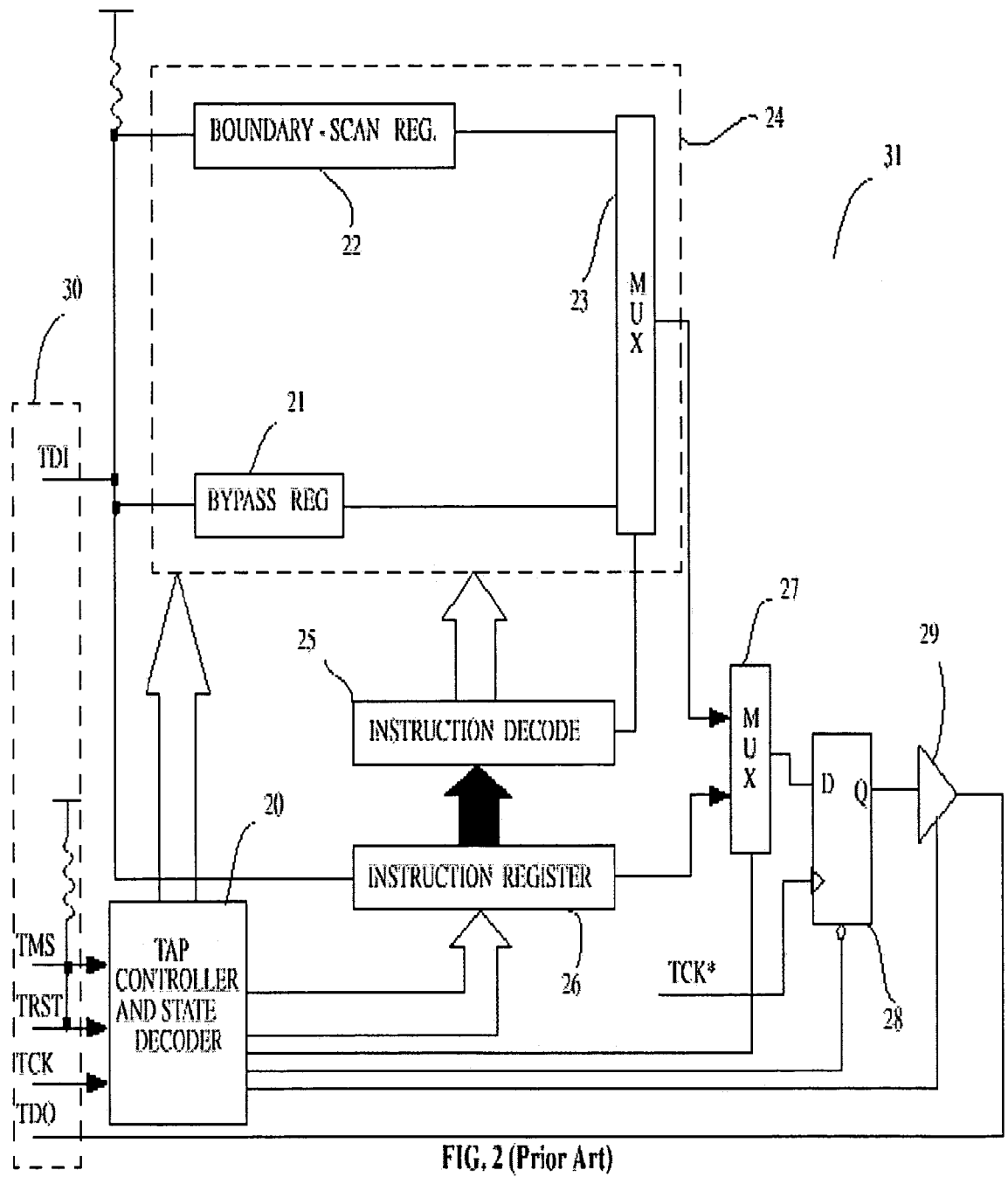
FIG. 2 shows an architecture diagram of the conventional device.
Figure 3:
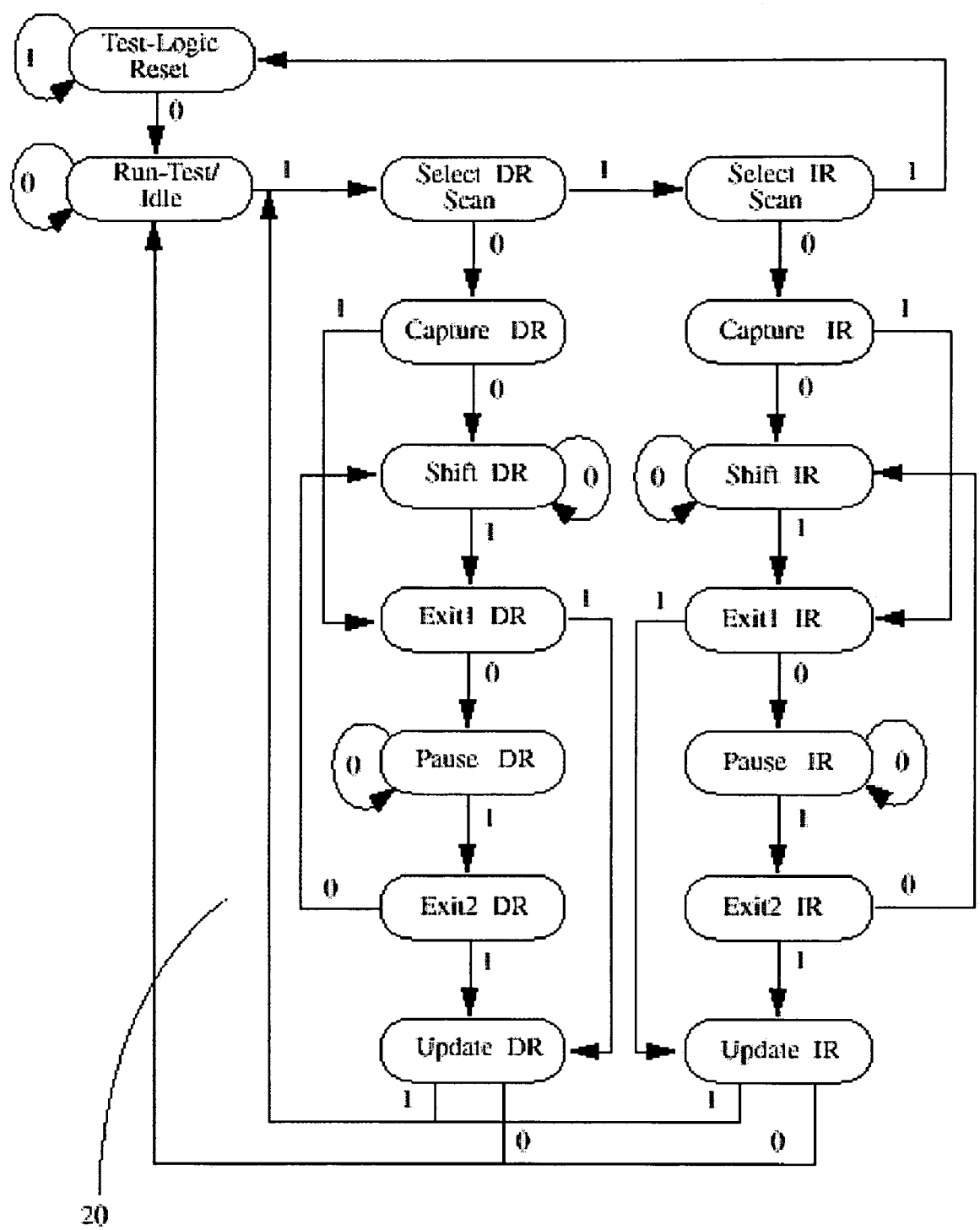
FIG. 3 shows the sixteen states of the state machine TAP controller of the conventional device.
Figure 4:
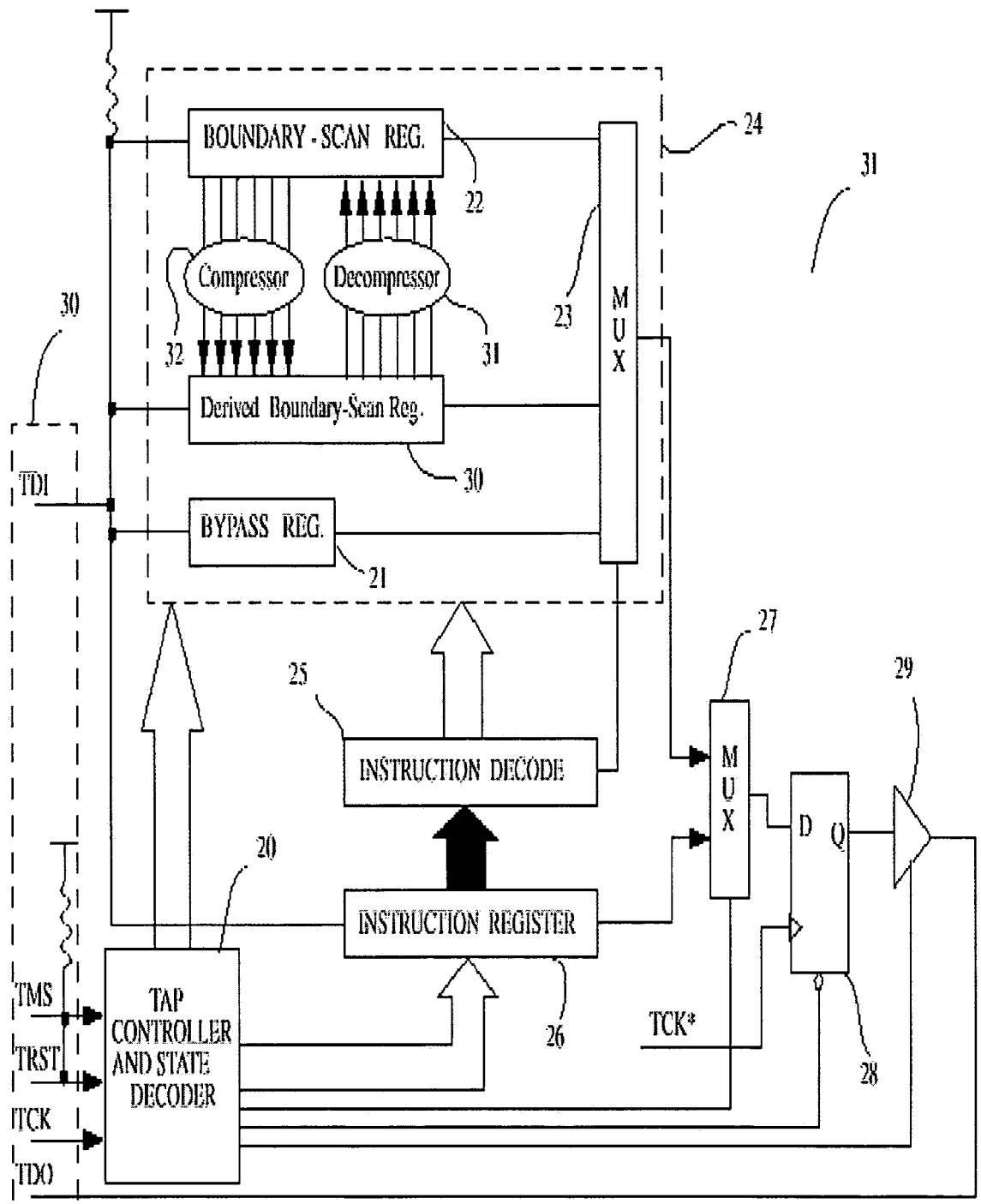
FIG. 4 shows the architecture of a device according to a preferred embodiment of the present invention.

FIG. 4 is a diagram of a device according to a preferred embodiment of the present invention. As shown, the device includes a Test Access Port (TAP) 30, a TAP controller 20, an instruction register 26, instruction decode logic 25, a data register bank 24, and an output stage comprising multiplexer 27, flip-flop 28, and tristate buffer 29. Although the instruction decode logic 25 is shown as being separate from the instruction register 26 in this embodiment, in further embodiments the instruction decode logic 25 is part of the instruction register 26. The data register bank 24 includes the boundary scan register 22, a compressor 32, a decompressor 31, a derived boundary scan register 30 and a bypass register 21. The bypass register 21 is a single bit shift register not associated with the IC core logic (memory latches) or I/O pins. Its purpose is to provide an alternate serial path between the TDI and TDO pins of a JTAG compliant device. As described below, only one of the registers in data bank 24 forms the serial path between TDI and TDO at any given time.

The TAP 30 is the interface between the boundary-scan architecture 31 and the five IC device pins required by IEEE 1149.1: test data in (TDI) and test data out (TDO) pins described above, test clock (TCK) pin, test mode select (TMS) pin, and one optional pin test reset (TRST) pin.

In the data register bank 24, the three components of the compressor 32, the decompressor 31, and the derived boundary scan register 30 can be programmed in any programmable device. The compressor 32 and the decompressor 31 are sandwiched between the main boundary scan register 22 and the derived boundary scan register 30, such that in this embodiment the data flow between the main boundary scan register 22 and the derived boundary scan register 30 is possible only through the compressor 32 and the decompressor 31. Compressed data is shifted into the derived boundary scan register 30 through the TDI pin during shifting out of the already captured compressed data from the compressor 32 to the multiplexer. This loaded compressed data in derived boundary scan register 30 is decompressed to the original form by the decompressor 31 by using the same algorithm that was used to compress the data before loading into the device, and loaded into the main boundary scan register 22. This decompressed data present in the boundary scan register 22 is passed to the boundary of the programmable device where the test vector is to be applied.

At the input side of the device, the compressor 32 is configured so that the data coming from the input pins of the IC can pass through the compressor 32 after capture in main boundary scan register 22, and the compressed data thus obtained from the compressor is captured in the derived boundary scan register 30 and shifted to the multiplexer. The length of the derived boundary scan register 30 depends on the compression and decompression technique used.

The instruction transferred to the bank of output elements in the instruction register 26 is decoded by the instruction decode logic 25 to select one of the registers in the data register bank 24 to form a serial path between the TDI and TDO pins of the IC device through a multiplexer 23, which is controlled by signals coming from the instruction decode logic 25, to pass the output of either the boundary scan register 22 or the bypass register 21 to the output stage (multiplexer 27, flip-flop 28, and tristate buffer 29). The instruction in the instruction register 26 is also decoded by the instruction decode logic 25 to select the source of data shifted into the boundary scan register.

Figure 5:
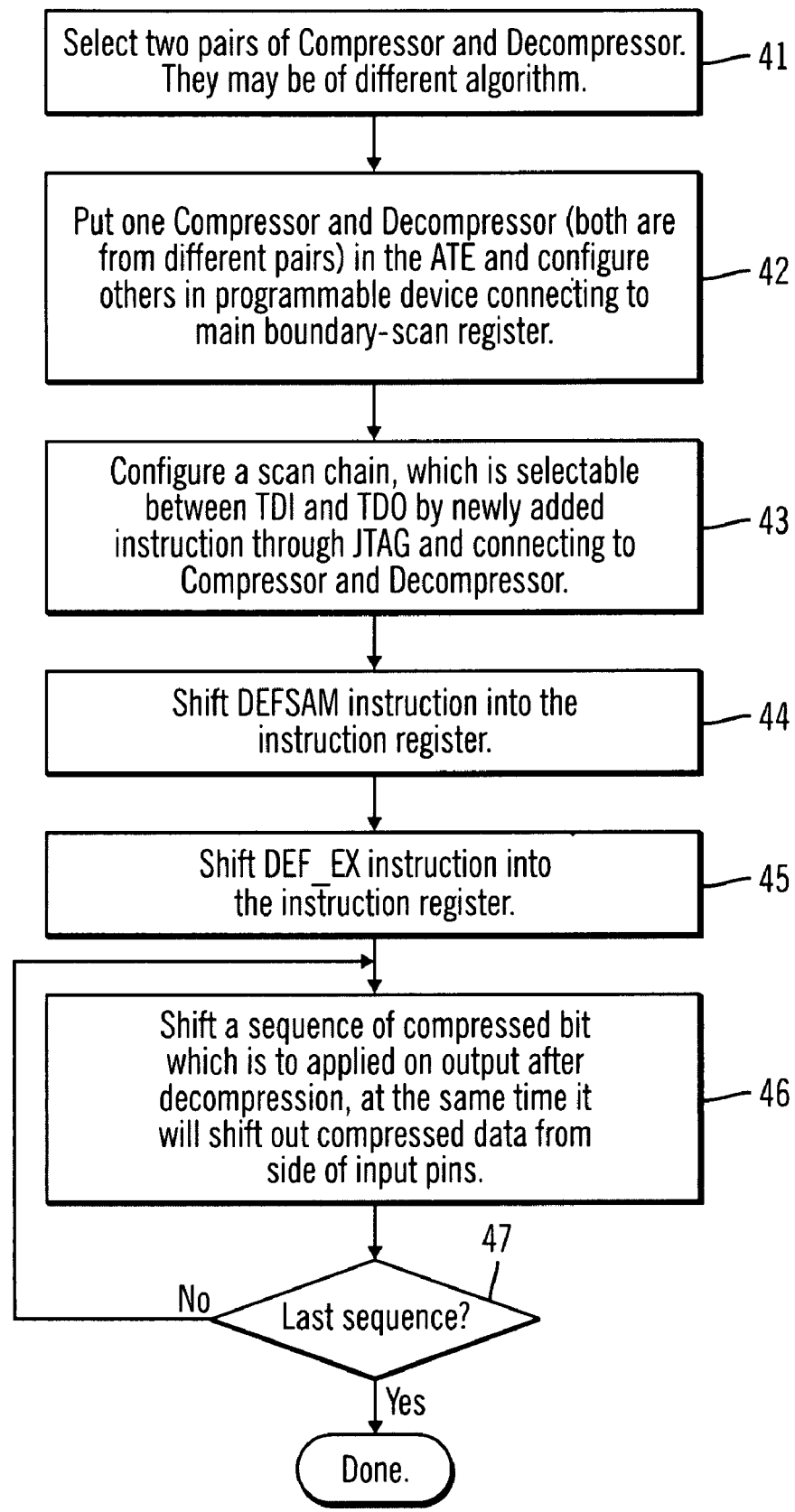
FIG. 5 shows a flow diagram illustrating an operation sequence for performing on-board programming according to one embodiment of the present invention.

FIG. 5 represents the flow diagram of the operation sequence to be performed according to one embodiment of the present invention. At step 41, two pair of compressors and decompressors are selected. One part of the pair is kept in the system and other part is configured in the programmable device. The two pairs of compressor and decompressor may be of same algorithm or different algorithms. Next, at step 42, the compressor and the decompressor are configured by putting the compressor on the input side of the main boundary scan register and the decompressor on the output side of the main boundary scan register. The position of the compressor and the decompressor can be changed depending on the testing to be done. Further, at step 43, a derived boundary scan register is configured. At step 44, an instruction DEFSAM targeting the derived boundary scan register and updating the main boundary scan register, similar to the SAMPLE/PRELOAD instruction, is loaded in the instruction register, and then a compressed test vector is loaded in the "shift DR" state of the TAP controller. In the "Update DR" state, a compressed test vector is decompressed and applied to the main boundary scan register. Instruction DEFSAM is prerequisite for instruction DEF_EX, same as instruction SAMPLE/PRELOAD is prerequisite for instruction EXTEST. At step 45, instruction DEF_EX, similar to EXTEST, is loaded in the instruction register and in the "Update IR" state of a TAP controller, the decompressed test vector is applied to the output pins of the device. In the "Capture DR" state, data on the input pins is first compressed and then captured in the derived boundary scan register. Step 46 is repeated until condition 47 is fulfilled.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A boundary scan tester for a logic device, the boundary scan tester comprising:

a boundary scan register coupled between core logic circuitry and I/O pins of the logic device, the boundary scan register storing a decompressed vector to be applied to the logic device and storing a test response received from the logic device;

a derived boundary scan register for shifting in and storing a compressed test vector and for storing and shifting out a compressed test response;

a data decompressor having an input coupled to an output of the derived boundary scan register and an output coupled to an input of the boundary scan register, the data decompressor decompressing the compressed test vector stored in the derived boundary scan register to produce the decompressed test vector, and supplying the decompressed test vector to the boundary scan register; and a data compressor having an input coupled to an output of the boundary scan register and an output coupled to an input of the derived boundary scan register, the data compressor compressing the test response stored in the boundary scan register to produce the compressed test response, and supplying the compressed test response to the derived boundary scan register.

2. The boundary scan tester as defined in claim 1, wherein the logic device is a programmable logic device, and the data decompressor, the data compressor, and the derived boundary scan register comprise programmable logic elements.

3. The boundary scan tester as defined in claim 1, wherein the boundary scan register and the derived boundary scan register comprise memory elements.

4. The boundary scan tester as defined in claim 3, wherein the memory elements include flip-flops.

5. The boundary scan tester as defined in claim 1, wherein the data decompressor and the data compressor include at least one of a digital signal processor and a series of data encoders and decoders.

6. The boundary scan tester as defined in claim 1, wherein the length of the derived boundary scan register depends on the degree of compression and the compression algorithm.

7. The boundary scan tester as defined in claim 1, further comprising:
  a test data in pin coupled to the derived boundary scan register,
  wherein the compressed test vector is shifted into the derived boundary scan register from the test data in pin.

8. The boundary scan tester as defined in claim 7, further comprising:
  a test data out pin coupled to derived boundary scan register,
  wherein the compressed test response is shifted out of the derived boundary scan register to the test data out pin.

9. The boundary scan tester as defined in claim 1, wherein test data to be applied to the logic device is compressed to produce the compressed test vector, and the compressed test vector is decompressed to its original form by the decompressor by using the same algorithm that was used to compress the test data.

10. A method for boundary scan testing of a logic device, the method comprising the steps of:
  shifting in a compressed test vector from a test data in pin;
  decompressing the compressed test vector to produce a decompressed test vector;
  storing the decompressed test vector in a boundary scan register that is coupled between core logic circuitry and I/O pins of the logic device;
  storing in the boundary scan register a test result received from the logic device;
  compressing the test result stored in the boundary scan register to produce a compressed test result; and
  shifting out the compressed test result to a test data out pin.

11. The method as defined in claim 10,
  wherein the logic device is a programmable logic device, and
  the decompressing step and the compressing step are performed by programmable logic within the programmable logic device.

12. The method as defined in claim 10, further comprising the step of:
  before the step of shifting in, compressing test data to be applied to the logic device to produce the compressed test vector,
  wherein in the decompressing step, the compressed test vector is decompressed to its original form by using the same algorithm that was used to compress the test data.

13. The method as defined in claim 12, further comprising the step of:
  after the step of shifting out, decompressing the compressed test result to its original form by using the same algorithm that was used to compress the test result.

14. An integrated circuit comprising:
  at least one logic device having core logic circuitry coupled to I/O pins;
  a test data in pin;
  a test data out pin; and
  a boundary scan tester coupled to the logic device for testing the logic device, the boundary scan tester including:
    a boundary scan register coupled between the core logic circuitry and the I/O pins of the logic device, the boundary scan register storing a decompressed test vector to be applied to the logic device and storing a test response received from the logic device;
    a derived boundary scan register coupled to the test data in pin and the test data out pin, the derived boundary scan register shifting in from the test data in pin and storing a compressed test vector, and storing and shifting out to the test data out pin a compressed test response;
    a data decompressor having an input coupled to an output of the derived boundary scan register and an output coupled to an input of the boundary scan register, the data decompressor decompressing the compressed test vector stored in the derived boundary scan register to produce the decompressed test vector, and supplying the decompressed test vector to the boundary scan register; and
    a data compressor having an input coupled to an output of the boundary scan register and an output coupled to an input of the derived boundary scan register, the data compressor compressing the test response stored in the boundary scan register to produce the compressed test response, and supplying the compressed test response to the derived boundary scan register.

15. The integrated circuit as defined in claim 14,
  wherein the logic device is a programmable logic device, and
  the data decompressor, the data compressor, and the derived boundary scan register of the boundary scan tester comprise programmable logic elements.

16. The integrated circuit as defined in claim 14, wherein the boundary scan register and the derived boundary scan register of the boundary scan tester comprise memory elements.

17. The integrated circuit as defined in claim 16, wherein the memory elements include flip-flops.

18. The integrated circuit as defined in claim 14, wherein the data decompressor and the data compressor of the boundary scan tester include at least one of a digital signal processor and a series of data encoders and decoders.

19. The integrated circuit as defined in claim 14, wherein the length of the derived boundary scan register of the boundary scan tester depends on the degree of compression and the compression algorithm.

* * * * *